United States Patent [19]

Kraemer

[11] 4,295,100

[45] Oct. 13, 1981

[54] MICROPHONE AMPLIFIER, IN PARTICULAR FOR TELEPHONE SYSTEMS

[75] Inventor: Horst Kraemer, Munich, Fed. Rep. of Germany

[73] Assignee: Siemens Aktiengesellschaft, Berlin & Munich, Fed. Rep. of Germany

[21] Appl. No.: 90,468

[22] Filed: Nov. 1, 1979

[30] Foreign Application Priority Data

Nov. 23, 1978 [DE] Fed. Rep. of Germany ....... 2850792

[51] Int. Cl.³ .......................... H03F 3/45; H03F 3/68
[52] U.S. Cl. .................... 330/257; 330/260; 330/311
[58] Field of Search ................ 330/257, 260, 261, 311

[56] References Cited

U.S. PATENT DOCUMENTS

| 3,581,084 | 5/1971 | Kaneno et al. | 246/249 |
| 3,668,320 | 6/1972 | Duck | 179/1 A |
| 4,135,162 | 1/1979 | Takahashi | 330/257 |
| 4,140,878 | 2/1979 | Ohsawa | 179/15 BT |

FOREIGN PATENT DOCUMENTS 2440023 3/1976 Fed. Rep. of Germany .
1517246 7/1978 United Kingdom .

OTHER PUBLICATIONS

Hartmuth, Duck, Jenik *Aufbau und Anwendung integrierter Halbleiterschaltungen* vol. 1, 1969 p. 13.
Kessel, Plassche *Integiierbare Grundschaltungen fur analoge Signale* Philips Technische Rundschau 1971/1972 Num. 1 pp. 4-8.
Siemens Datenbuch 1974/1975 Band 2 *Lineare Schaltungen* pp. 213-215.

*Primary Examiner*—James B. Mullins
*Assistant Examiner*—Gene Wan
*Attorney, Agent, or Firm*—Hill, Van Santen, Steadman, Chiara & Simpson

[57] ABSTRACT

In a microphone amplifier a differential amplifier input stage is coupled to a Darlington amplifier output stage by way of a symmetrically connected coupling stage and a two-stage intermediate amplifier. A negative feedback circuit is connected between the output and input stages and current mirror circuits are connected to the coupling stage and to the input stage for providing current symmetry.

8 Claims, 1 Drawing Figure

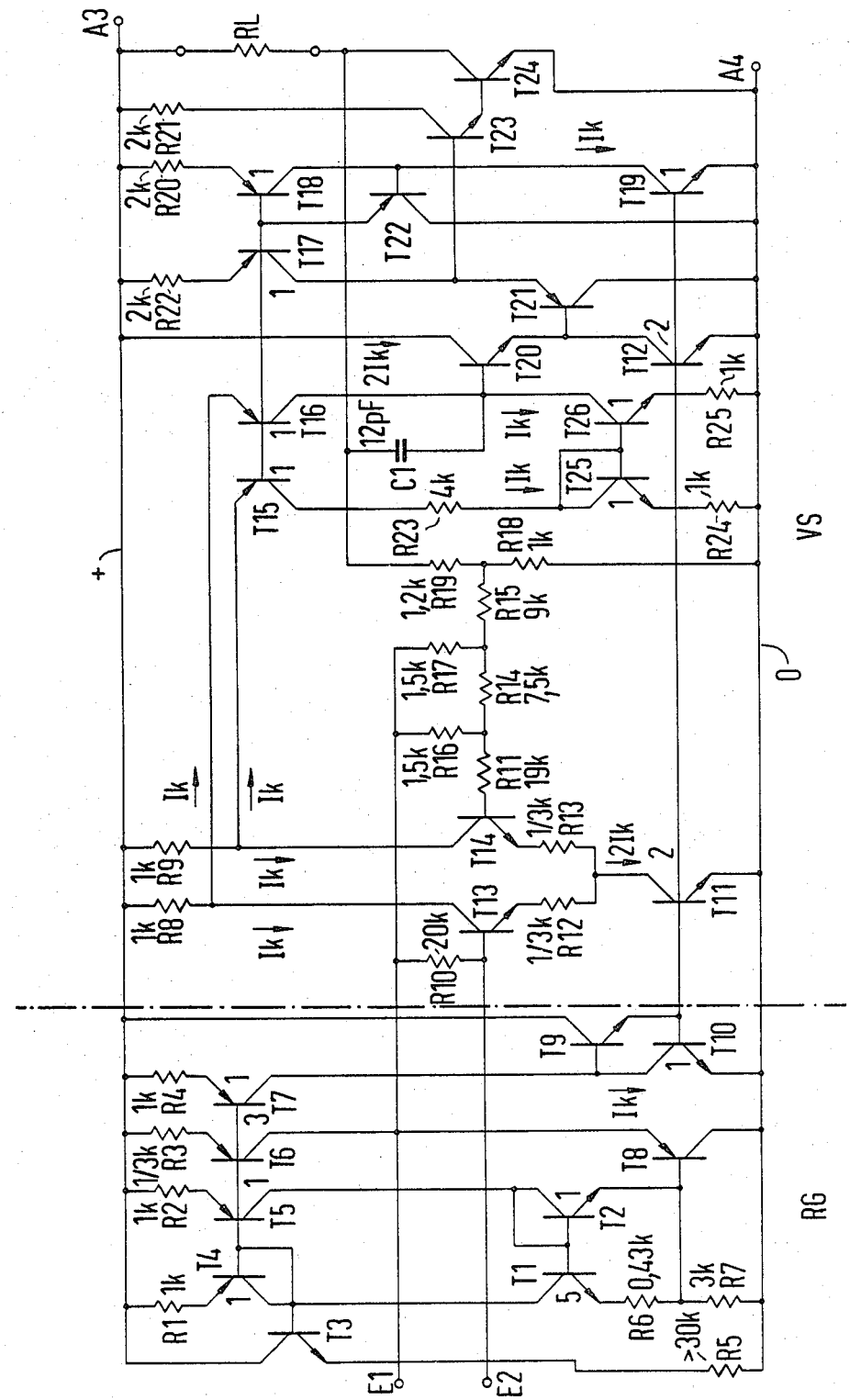

MICROPHONE AMPLIFIER, IN PARTICULAR FOR TELEPHONE SYSTEMS

BACKGROUND OF THE INVENTION

1. Field of the Invention

The present invention relates to amplifiers, and is particularly concerned with microphone amplifiers which may be used in telephone systems.

2. Description of the Prior Art

It is known in the art to use microphone amplifiers in telephone systems, and in fact when, for example, piezoelectric microphones are provided. Various circuit structures for these microphone amplifiers are also already known in the art. In microphone amplifiers of this type, the output signal is superimposed upon the feed current (see Siemens Datenbuch 1974/75, Vol. 2, "Lineare Schaltungen", pp. 213–215; and German Pat. Nos. 17 62 924 and 18 08 247). These microphone amplifiers comprise, by way of an input stage, a differential amplifier comprising two transistors provided with resistance stabilization in the emitter circuit, by way of an output stage a Darlington amplifier which operates as a controlled voltage source, a negative voltage feedback network connected between the output and the input, and a reference voltage source which serves to stabilize the operating point of the differential amplifier.

SUMMARY OF THE INVENTION

The object of the present invention is to improve the operating properties of microphone amplifiers.

The improvement in microphone amplifiers relates, in particular, to measures which safeguard the stability of the operating points of the associated transistors over a particularly wide range of feed current. This is particularly important for microphone amplifiers which form part of telephone systems, as it is known that in telephone systems the direct feed current can vary considerably.

A further development will provide that the microphone amplifier can, on the one hand, operate with a very low feed current and, on the other hand, possess good modulability.

According to the present invention, a microphone amplifier of this kind is characterized in that the differential amplifier is coupled via a symmetrically-connected transistor coupling stage and via a two-stage intermediate amplifier to the Darlington amplifier, and that the input stage and the coupling stage of the amplifier circuit are set to be symmetrical in respect of current by means of current mirror circuits. Current mirror circuits are known per se (see German published application Nos. 24 40 023 and 26 42 874; Philips Technische Rundschau 1971/72, No. 1, pp. 4–8; Regelungstechnik, Vol. 1, 1969, p. 13). Due to the fact that the differential amplifier is coupled in the given manner to the Darlington amplifier and the relevant circuits are set to be symmetrical in respect of current, the desired good symmetry properties and the high stability of the operating points are ensured. In addition, the amplifier operates even at a very low operating voltage and permits a wide range for the d.c. current feed.

An advantageous further development of the microphone amplifier resides in the fact that the Darlington amplifier is constructed with two transistors which have their own collector resistors. A Darlington amplifier of this kind, in effect, has particularly high modulability. Here, it is expedient to use an output transistor having a low saturation voltage. It is also expedient to use a reference voltage source which supplies a particularly low stabilized reference voltage.

BRIEF DESCRIPTION OF THE DRAWING

Other objects, features and advantages of the invention, its organization, construction and operation will be best understood from the following detailed description, taken in conjunction with the accompanying drawing, on which there is a single schematic circuit diagram of a microphone amplifier including an amplifier circuit with a reference voltage source.

DESCRIPTION OF THE PREFERRED EMBODIMENTS

Referring to the drawing, a microphone amplifier is schematically illustrated as comprising an amplifier circuit VS and a reference voltage source RG.

Referring first to the amplifier circuit VS, an input is provided at the terminals E1 and E2, and an output is provided at the terminals A3 and A4. An acousto-electric transducer, in particular a piezoelectric ceramic (not shown) is connected to the input terminals E1 and E2. The operating voltage $+/0$ and, therefore, also the d.c. feed current are supplied via the output terminals A3 and A4 so that the output signal is then superimposed on the d.c. feed current.

The reference voltage supplied by the reference voltage source RG is also connected to the input terminal E1 and serves to stabilize the operating point of a differential amplifier comprising a pair of transistors T13 and T14 which forms part of the amplifier circuit VS.

The amplifier circuit comprises the differential amplifier which includes the transistors T13 and T14, the emitter resistors R12 and R13, and the collector resistors R8 and R9, a transistor coupling stage which comprises a pair of transistors T15 and T16, a two-stage intermediate amplifier which comprises a pair of transistors T20 and T21, and a Darlington amplifier which comprises a pair of transistors T23 and T24. The transistor T23 is provided with a collector resistor R21 and the transistor T24 is provided with a collector resistor RL.

A negative feedback network comprising a plurality of resistors R19, R18, R15, R14, R11, R17, R16 and R10 is interposed between the output of the amplifier and the input of the amplifier. The operating point of the output transistors is set via a voltage divider which comprises the resistors R19 and R18 and via the resistors R14 and R15 with the assistance of the reference voltage supplied by the reference voltage source RG. The operating points of the differential amplifier which comprises the transistors T13 and T14 are determined via the resistors R10 and R11 with the aid of the reference voltage. The voltage amplification of the microphone amplifier is established via the resistors R15 and R16 and the resistor R14 in the course of the associated negative feedback arm.

Here three current mirror circuits are also provided, by means of which the coupling stage, namely the symmetrically connected transistor coupling stage comprising the transistors T15 and T16 and the two-stage intermediate amplifier comprising the transistors T20 and T21 and the input stage comprising the transistors T13 and T14 are set symmetrical in respect of current. The transistors T15 and T16 of the transistor coupling stage also form part of a current mirror circuit comprising the transistors T17 and T18. By this means, and with the assistance of the additional current mirror circuit comprising the transistors T25 and T26 and the resistors R24 and R25 and the further current mirror circuit comprising the transistors T9, T10, T11, T12 and T19, the coupling stage and the input stage are set symmetrically in respect of current. The transistors T15 and T16 which form part of the transistor coupling stage are identical to one another. There emitters are individually connected to the collectors of the transistors T13 and T14 of the differential amplifier. The collectors of the transistors T15 and T16 are connected to the two current arms of the aforementioned current mirror circuit comprising the transistors T25 and T26. Then, the intermediate amplifier which comprises the transistors T20 and T21 is connected to one of the two collectors.

The primary circuits of the transistors T20 and T21 of the intermediate amplifier are also linked via current arms to current mirror circuits. These include the aforementioned current mirror circuit which comprises the transistors T17, T18 and T22 and the resistors R20 and R22 and via the current arm comprising the transistor T17, the emitter circuit of the transistor T21 of the intermediate amplifier is connected. This current mirror circuit also possesses a second current arm comprising the transistor T18 which is arranged in series to a current arm of the other current mirror circuit which comprises the transistors T9, T10, T11, T12 and T19. The current arm which comprises the transistor T18 is arranged in series to the associated current arm comprising the transistor T19. The emitter circuit of the transistor T20 of the intermediate amplifier extends across the second current arm comprising the transistor T12 of the other current mirror circuit. This other current mirror circuit also possesses an additional current arm comprising the transistor T11 which is connected in the common emitter circuit of the differential amplifier comprising the transistors T13 and T14.

The aforementioned current mirror circuits serve to set the symmetrically-connected transistor coupling stage comprising the transistors T15 and T16, the two-stage intermediate amplifier comprising the transistors T20 and T21, and the input stage comprising the transistors T13 and T14, in each case symmetrically in respect of current. This results in a particularly stable mode of operation of the amplifier circuit. However, it is also apparent that the amplifier properties are not particularly dependent upon the feed conditions of the circuit. The very low operating voltage requirement of the circuit and the other favorable properties also result in the high modulability of the amplifier circuit. The negative feedback capacitor C1 also helps to stabilize the circuit.

The ohmic values of the various resistors utilized in the circuit are provided on the drawing adjacent the resistors. The symbols used to represent the transistors also indicate whether the transistor is a pnp transistor or an npn transistor. Finally, arrows marked "Ik" and "2Ik" which indicate the direction and magnitude of the currents flowing in the relevant current arms have also been entered on the drawing. These currents are produced, in particular, because the described current mirror circuits are provided. It should also be taken into account that the magnitude of the currents flowing in the current arms of the current mirror circuits are stepped in accordance with the size of the emitter surfaces of the transistors connected into these current arms. Therefore, the current 2Ik flows across the transistor T11, the current 2Ik likewise flows across the transistor T12, and the current Ik flows across the transistor T19. The relative size of the emitter surfaces of these transistors is also indicated by the digits 1 and 2. Also, in the case of other transistors, the size of emitter surfaces has been partially indicated by FIGURES where this is of special significance to the mode of operation of the circuit. This applies in particular to transistors which form part of the reference voltage source RG, such as the transistors T1, T2, T4, T5, T6 and T7 which are respectively provided with the digits 5, 1, 1, 1, 3 and 1.

The current mirror circuit which comprises the transistors T9, T10, T11, T12 and T19 is coupled to the output stage which comprises the transistors T6 and T8 of the reference voltage source by means of the transistor T7 and the resistor R4. This output stage comprises the series arrangement of these transistors T6 and T8, and the resistor R3. The reference voltage so formed for the amplifier circuit VS is taken from the connection point between the collector and emitter of the series-connected transistors T6 and T8.

In the reference voltage source RG, the reference voltage is connected to the bases, which are connected to one another, for the transistors T1 and T2 of which the transistor T2 is connected as a diode, whereas the transistor T1 is operated in a normal manner. The current mirror circuit comprising the transistors T4 and T5 and the resistors R1 and R2 is connected into the collector circuits of the transistors T1 and T2.

The aforementioned transistor T6 which forms part of the output stage is additionally connected in the current mirror circuit. The transistor T8 which therefore lies in series with the transistor T6 is connected to the reference potential 0. Its base is connected to the emitter resistors R6 and R7 of the transistors T1 and T2. Due to the fact that the reference voltage is tapped at the series connection of the transistors T6 and T8, overloading of the internal reference circuit point of the reference voltage source is avoided and, therefore, loading of the interconnected bases of the transistors T1 and T2 is likewise avoided. This also applies when the tap is used as the current source or current drain for the stabilization of the operating point of the amplifier circuit VS. This ensures a particularly high degree of stability of the reference voltage. The magnitude of the reference voltage itself is determined by the voltage connected to the internal reference voltage point. The voltage required to produce the reference voltage is very low and, in fact, only exceeds the reference voltage which is connected to the emitter of the transistor T8 by the saturation voltage of the transistor T6.

The reference voltage source RG further comprises the starting circuit which is composed of the series arrangement of the transistors T3 and its emitter resistor R5. The operating voltage +/0 is connected across this starting circuit. The base of the transistor T3 is connected to the collector of the transistor T1. This ensures that when the operating voltage is applied to the internal reference circuit point, the given reference voltage is established.

In the case of the reference voltage source RG, the surface of the emitter of the transistor T2 which is connected as a diode forms a fraction of the surface of the emitter of the associated transistor T1. By this means, and by the other provided circuit measures, a temperature compensation takes place inasmuch as the reference voltage attained is largely independent of the temperature (see also "Regelungstechnik", Vol. 1, 1969, p.

13; and German allowed application No. 19 44 028, column 1). In the circuit example illustrated on the drawing, the surface of the emitter of the transistor T1 is five times the size of the surface of the emitter of the transistor T2. This is also indicated by the digits 5 and 1. The ratio of the resistance values of the emitter resistors R6 and R7 is also of significance with regard to the temperature compensation.

The current mirror circuit comprising the transistors T4, T5 and T6 also comprises an additional transistor T7 which feeds the current mirror circuit comprising the transistors T8, T9, T11, T12 and T19. The three last-mentioned transistors are connected into circuits of the amplifier circuit VS which is supplied with a reference voltage. The transistors T11, T12 and T19 have already been described above. The circuitry technique results in a specific current feed for the amplifier circuit for which purpose switching means are used which can be readily attached to the switching means which form part of the reference voltage source.

The circuitry of the above-described microphone amplifier is also designed to be such that it can be easily constructed within an integrated circuit. Its advantageous properties are thereby retained.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a microphone amplifier of the type providing common terminals on which an output signal is superimposed on its feed current, in which an input stage comprises an emitter resistance stabilized differential amplifier, an output stage comprising a two-transistor Darlington amplifier operating as a controlled voltage source, a negative feedback circuit connects the output and input stages, and a reference voltage source is connected to stabilize the operating point of the differential amplifier, the improvement therein comprising:
   coupling means connecting the differential amplifier to the Darlington amplifier, including a symmetrically connected transistor coupling stage and a two-stage intermediate amplifier; and
   current mirror circuits connected to said coupling stage and to the input stage for providing current symmetry therein.

2. In a microphone amplifier of the type providing an output signal superimposed on its feed current, in which an input stage comprises an emitter resistance stabilized differential amplifier, an output stage comprising a two-transistor Darlington amplifier operating as a controlled voltage source, a negative feedback circuit connects the output and input stages, and a reference voltage source is connected to stabilize the operating point of the differential amplifier, the improvement therein comprising:
   coupling means connecting the differential amplifier to the Darlington amplifier, including a symmetrically connected transistor coupling stage and a two-stage intermediate amplifier; and
   current mirror circuits connected to said coupling stage and to the input stage for providing current symmetry therein; said coupling stage and the differential amplifier each comprising a pair of transistors each including a base, an emitter, and a collector;
   said emitters of said coupling stage transistors connected to respective collectors of the differential amplifier transistors;
   a first of said current mirror circuits including a pair of current arms connected to respective collectors of said coupling stage transistors; and
   said intermediate stage connected to one of said coupling stage transistor collectors.

3. The improved microphone amplifier of claim 2, wherein:
   said intermediate stage comprises two transistors each including a primary current path connected to a second of said current mirror circuits.

4. The improved microphone amplifier of claim 3, wherein:
   said second current mirror circuit includes first and second current arms connected to respective primary current paths of said two transistors of said intermediate stage and a third current arm connected in series with a third of said current mirror circuits, said third current mirror circuit connected to said second current arm of said second current mirror circuit.

5. The improved microphone amplifier of claim 4, wherein:
   said third current mirror circuit includes a current arm connected in series with the emitters of the differential amplifier.

6. The improved microphone amplifier of claim 5, wherein:
   the reference voltage source comprises first and second transistors each including a base connected to the like base of the other, an emitter and a collector, said first transistor connected as a diode, and means applying a reference potential to said connected bases, and an output stage comprises two transistors operable, without loading, as a current source or a current drain connected to and operating to stabilize the operating point of the differential amplifier; and
   said third current mirror circuit including a current arm connected to said output stage.

7. The improved microphone amplifier of claim 6, wherein:
   said current arms of said current mirror circuits each include transistors and means providing different selected current flows, said means including the size of the emitter surfaces of said transistors.

8. The improved microphone amplifier of claim 7, wherein:
   a pair of collector resistances are connected to respective transistors of the Darlington amplifier.

* * * * *